(12) United States Patent
Hazbun et al.

(10) Patent No.: US 11,842,940 B2
(45) Date of Patent: Dec. 12, 2023

(54) SEMICONDUCTOR STRUCTURE HAVING A THERMAL SHUNT BELOW A METALLIZATION LAYER AND INTEGRATION SCHEMES

(71) Applicant: GLOBALFOUNDRIES U.S. Inc., Santa Clara, CA (US)

(72) Inventors: Ramsey Hazbun, Colchester, VT (US); Siva P. Adusumilli, South Burlington, VT (US); Mark David Levy, Williston, VT (US); Alvin Joseph, Williston, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 26 days.

(21) Appl. No.: 17/156,634

(22) Filed: Jan. 25, 2021

(65) Prior Publication Data
US 2022/0238409 A1   Jul. 28, 2022

(51) Int. Cl.
*H01L 23/367*     (2006.01)
*H01L 21/48*      (2006.01)

(52) U.S. Cl.
CPC ........ *H01L 23/367* (2013.01); *H01L 21/4882* (2013.01)

(58) Field of Classification Search
None
See application file for complete search history.

(56) References Cited

U.S. PATENT DOCUMENTS

| | | | |
|---|---|---|---|
| 6,288,426 B1 * | 9/2001 | Gauthier, Jr. | H01L 23/3677 257/524 |
| 6,744,072 B2 | 6/2004 | Romano et al. | |
| 6,956,250 B2 | 10/2005 | Borges et al. | |
| 8,450,804 B2 | 5/2013 | Sekar et al. | |
| 8,575,657 B2 | 11/2013 | Gambin et al. | |
| 9,530,711 B2 | 12/2016 | Botula et al. | |
| 9,640,531 B1 | 5/2017 | Or-Bach et al. | |
| 2007/0205502 A1 | 9/2007 | Liu et al. | |
| 2010/0019385 A1 * | 1/2010 | Bartley | H01L 29/78639 257/E21.536 |

* cited by examiner

*Primary Examiner* — Jack S Chen
(74) *Attorney, Agent, or Firm* — Anthony Canale

(57) ABSTRACT

A semiconductor structure is provided. The semiconductor structure comprises a heat generating device arranged over a substrate. An interlayer dielectric (ILD) material may be arranged over the heat generating device and the substrate. A metallization layer may be arranged over the interlayer dielectric material. A thermal shunt structure may be arranged proximal the heat generating device, whereby an upper portion of the thermal shunt structure may be arranged in the interlayer dielectric material and may be lower than the metallization layer, and a lower portion of the thermal shunt structure may be arranged in the substrate.

20 Claims, 7 Drawing Sheets

SEMICONDUCTOR STRUCTURE HAVING A THERMAL SHUNT BELOW A METALLIZATION LAYER AND INTEGRATION SCHEMES

FIELD OF THE INVENTION

The disclosed embodiments relate generally to semiconductor structures, and more particularly, to semiconductor structures having a thermal shunt with enhanced heat dissipation, high density and a compact size.

BACKGROUND

Semiconductor devices continue to increase in power density, leading to increasing challenges for heat dissipation from heat generating devices or active regions of a substrate. Inefficient heat dissipation may lead to increase in the semiconductor device temperature leading to performance degradation.

Heat may be dissipated through upper metallization layers to an external heat sink. However, integration of additional metallization structures for heat conduction increases total device area and reduces device density. A thermal shunt structure connected to the upper metallization layers may need to be placed a distance away from the heat generating device or the active region of a substrate to ensure electrical isolation, thereby leading to inefficient heat transfer and a larger device area. Thus, there is a need to overcome the challenges mentioned above.

SUMMARY

In an aspect of the present disclosure, a semiconductor structure is provided. The semiconductor structure comprises a heat generating device arranged over a substrate. An interlayer dielectric (ILD) material may be arranged over the heat generating device and the substrate. A metallization layer may be arranged over the interlayer dielectric material. A thermal shunt structure may be arranged proximal the heat generating device, whereby an upper portion of the thermal shunt structure may be arranged in the interlayer dielectric material and below the metallization layer, and a lower portion of the thermal shunt structure may be arranged in the substrate.

In another aspect of the present disclosure, a semiconductor structure is provided. The semiconductor structure comprises a heat generating device arranged over a substrate. An interlayer dielectric (ILD) material may be arranged over the heat generating device and the substrate. A metallization layer may be arranged over the interlayer dielectric material. A thermal shunt structure may be arranged proximal the heat generating device, whereby an upper portion of the thermal shunt structure may be arranged in the interlayer dielectric material and is spaced from the metallization layer, and a lower portion of the thermal shunt structure may be arranged in the substrate. An electrically insulating dielectric liner may be arranged on a side surface and a bottom surface of the thermal shunt structure. A barrier dielectric layer may be arranged over at least a portion of a top surface of the thermal shunt structure, whereby the barrier dielectric layer is between the thermal shunt structure and the interlayer dielectric material.

In yet another aspect of the present disclosure, a method of fabricating a semiconductor structure is provided. The method comprises providing a heat generating device over a substrate. An interlayer dielectric material may be provided over the heat generating device and the substrate. A thermal shunt structure may be provided proximal the heat generating device, whereby an upper portion of the thermal shunt structure may be arranged in the interlayer dielectric material and a lower portion of the thermal shunt structure may be arranged in the substrate. A metallization layer may be provided over the interlayer dielectric material, whereby the upper portion of the thermal shunt structure may be below the metallization layer.

Numerous advantages may be derived from the embodiments described below. The embodiments provide a thermal shunt structure positioned next to a heat generating device thereby leading to efficient heat dissipation from the heat generating device and the substrate. The thermal shunt structure may not be connected to a metallization layer and may be lower than the metallization layer. Thereby the thermal shunt structure may be positioned near the heat generating device and an active region of a substrate. The structure is compact as there are no additional metallization layers needed for heat dissipation thereby enhancing the device density.

BRIEF DESCRIPTION OF THE DRAWINGS

The disclosed embodiments will be better understood from a reading of the following detailed description, taken in conjunction with the accompanying drawings.

Figure 1:
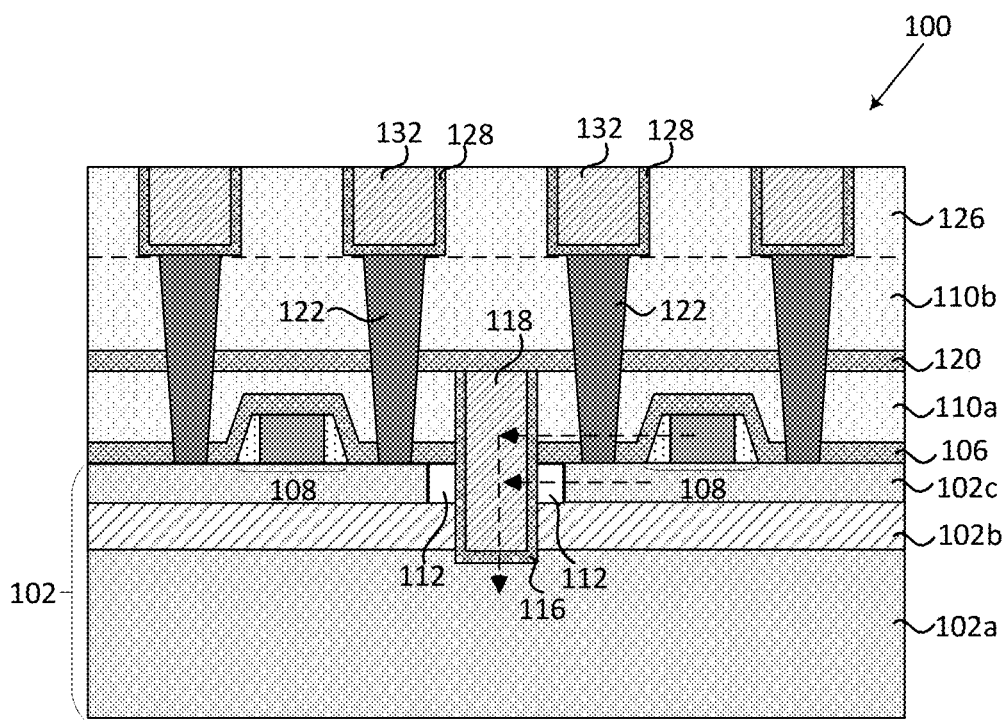
FIG. 1 illustrates a semiconductor structure, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the devices. Additionally, elements in the drawings are not necessarily drawn to scale. For example, the dimensions of some of the elements in the drawings may be exaggerated relative to other elements to help improve understanding of embodiments of the devices. The same reference numerals in different drawings denote the same elements, while similar reference numerals may, but do not necessarily, denote similar elements.

DETAILED DESCRIPTION

The following detailed description is exemplary in nature and is not intended to limit the devices or the application and uses of the devices. Furthermore, there is no intention to be bound by any theory presented in the preceding background of the devices or the following detailed description.

FIG. 1 illustrates a semiconductor structure 100, according to an embodiment of the disclosure. The semiconductor structure 100 includes a heat generating device 108 arranged over a substrate 102. In one embodiment, the heat generating device 108 may be a field effect transistor (FET). A first 110a and a second 110b interlayer dielectric (ILD) material may be arranged over the heat generating device 108 and the substrate 102. The second 110b interlayer dielectric material may be arranged over the first 110a interlayer dielectric material. The first 110a and the second 110b interlayer dielectric material may collectively be referred to as interlayer dielectric material 110. A metallization layer 132 may be arranged over the interlayer dielectric material 110. A thermal shunt structure 118 may be arranged proximal to the heat generating device 108. An upper portion of the thermal shunt structure 118 may be arranged in the interlayer dielectric material 110 and may be below the metallization layer 132. A portion of the interlayer dielectric material 110 may be between a top surface of the thermal shunt structure 118 and the metallization layer 132. In one embodiment, the thermal shunt structure 118 may be electrically insulated from the metallization layer 132. A lower portion of the thermal shunt structure 118 may be arranged in the substrate 102. From a top down perspective, the thermal shunt structure 118 may be a square, oval, circle, rectangle, a ring around the heat generating device 108 or a c-shaped feature.

A thermally and electrically conductive barrier liner 116 may be arranged over a side surface and a bottom surface of the thermal shunt structure 118. In one embodiment, the thermal shunt structure 118 may be made of copper (Cu), aluminum (Al), tungsten (W), nickel (Ni) or any other suitable thermally conductive material. In one embodiment, the barrier liner 116 may be made of tantalum nitride (TaN) or any other suitable thermally and electrically conductive material. The barrier liner 116 may prevent diffusion of copper to the interlayer dielectric material 110 or the substrate 102.

An isolation structure 112 may be arranged adjacent to the lower portion of the thermal shunt structure 118 in the substrate 102. In one embodiment, the isolation structure 112 may be a shallow trench isolation (STI). The isolation structure 112 may be arranged between the thermal shunt structure 118 and an active layer 102c of the substrate 102 to electrically isolate the thermal shunt structure 118 from the active layer 102c. The heat generating device 108 may be arranged over the active layer 102c of the substrate 102. In one embodiment, the conductive barrier liner 116 may be arranged between the thermal shunt structure 118 and the isolation structure 112.

In one embodiment, the substrate 102 may be a silicon-on-insulator (SOI) substrate. The substrate 102 may include a base layer 102a, a first dielectric layer 102b and an active layer 102c. The first dielectric layer 102b may be arranged above the base layer 102a. The active layer 102c may be arranged above the first dielectric layer 102b. Although not shown, a source and a drain laterally adjacent to the heat generating device 108 may be formed in the active layer 102c. The base layer 102a may be made of silicon. The first dielectric layer 102b may be made of silicon dioxide. The active layer 102c may be made of silicon. The lower portion of the thermal shunt structure 118 may be arranged in the active layer 102c and the first dielectric layer 102b of the substrate 102. In one embodiment, the lower portion of the thermal shunt structure 118 may extend to the base layer 102a of the substrate 102. In one embodiment, a bottom surface of the thermal shunt structure 118 may be at least level with a top surface of the base layer 102a of the substrate 102. In an alternative embodiment, the bottom surface of the thermal shunt structure 118 may be lower than the top surface of the base layer 102a.

A barrier dielectric layer 120 may be arranged over a top surface of the thermal shunt structure 118 and may be between the thermal shunt structure 118, and the second interlayer dielectric material 110b. In one embodiment, the barrier dielectric layer 120 may be arranged over at least part of the top surface of the thermal shunt structure 118. The barrier dielectric layer 120 may be made of silicon nitride ($Si_3N_4$) or any other suitable dielectric material. The barrier dielectric layer 120 may prevent diffusion of copper to the interlayer dielectric material 110.

An etch stop layer 106 may be arranged over the heat generating device 108 and a top surface of the active layer 102c. The etch stop layer 106 may be made of silicon nitride or any other suitable dielectric material. A contact pillar 122 may be arranged in the interlayer dielectric material 110 below the metallization layer 132 and may extend through the barrier dielectric layer 102, and the etch stop layer 106 to contact the active layer 102c. The contact pillar 122 may electrically couple the metallization layer 132 to the active layer 102c. The etch stop layer 106 may prevent etching of the active layer 102c during formation of the contact pillar 122.

Heat generated by the heat generating device 108 during device operation may be conducted through a portion of the interlayer dielectric material 110 to the conductive barrier liner 116 and the thermal shunt structure 118. A dashed arrow illustrates a heat conduction path. The heat may be dissipated through the base layer 102a of the substrate 102. Alternatively, the heat may also be conducted from the active layer 102c through the isolation structure 112 and the thermal shunt structure 118. The thermal shunt structure 118 may be positioned lower than the metallization layer 132 and may not be connected to the metallization layer 132. Thereby, the thermal shunt structure 118 may be positioned close to the active layer 102c and the heat generating device 108, providing a compact device and efficient heat transfer.

Figure 2:
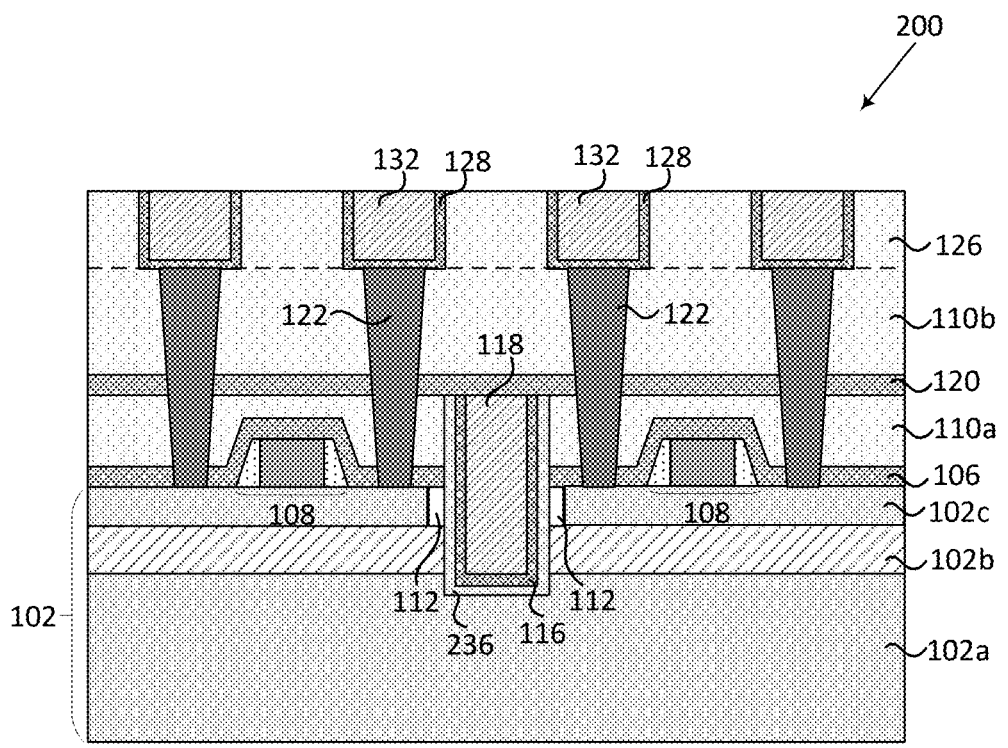
FIG. 2 illustrates a semiconductor structure, according to another embodiment of the disclosure.

FIG. 2 illustrates a semiconductor structure 200, according to another embodiment of the disclosure. Like numerals in FIG. 1 refer to like features in FIG. 2. In contrast to the semiconductor structure 100 shown in FIG. 1, the semiconductor structure 200 includes an electrically insulating liner 236 adjacent to a side surface and a bottom surface of the thermal shunt structure 118. The insulating liner 236 may be arranged between the isolation structure 112 and the lower portion of the thermal shunt structure 118. In one embodiment, the insulating liner 236 may be arranged next to the conductive barrier liner 116. The insulating liner 236 may be arranged between the thermal shunt structure 118 and the interlayer dielectric material 110. The insulating liner 236 electrically insulates the thermal shunt structure 118 from the active layer 102c, the heat generating device 108 and the base layer 102a of the substrate 102. The substrate 102, the heat generating device 108, the thermal shunt structure 118, the conductive barrier liner 116, a barrier dielectric layer 120, an etch stop layer 106, the interlayer dielectric material 110, a contact pillar 122 and a metallization layer 132 are similar to the semiconductor structure 100 illustrated in FIG. 1.

Figure 3:
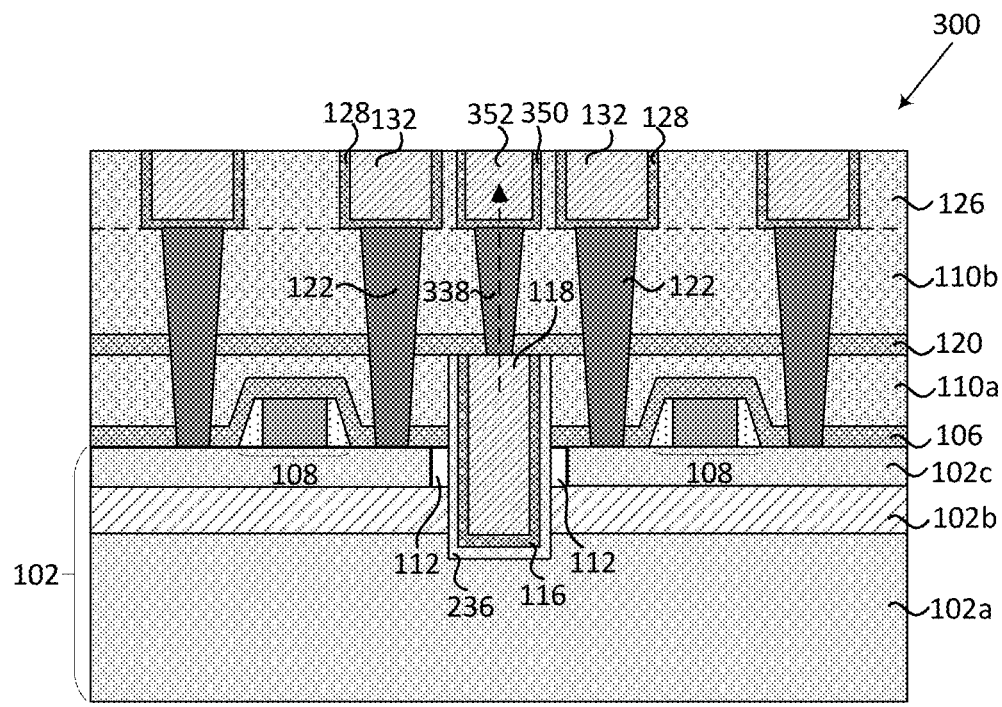
FIG. 3 illustrates a semiconductor structure, according to another embodiment of the disclosure.

FIG. 3 illustrates a semiconductor structure 300, according to another embodiment of the disclosure. Like numerals in FIGS. 1 and 2 refer to like features in FIG. 3. In contrast to the semiconductor structures 100 and 200 shown in FIGS.

1 and 2, respectively, the semiconductor structure 300 includes a contact pillar 338 arranged between a thermal shunt structure 118 and a metallization layer 352. The contact pillar 338 couples the thermal shunt structure 118 to the metallization layer 352. The contact pillar 338 may be arranged in an interlayer dielectric material 110 and extends through a barrier dielectric layer 120 to contact a top surface of the thermal shunt structure 118. The contact pillars 338 and 122 may be made of cobalt (Co), tungsten (W) or any other suitable electrically conductive material. The contact pillar 338 enables heat conduction from the thermal shunt structure 118 to the metallization layer 352 and an external heat sink, as shown by a dashed arrow. A substrate 102, a heat generating device 108, the thermal shunt structure 118, a conductive barrier liner 116, an insulating liner 236, an isolation structure 112, the barrier dielectric layer 120, an etch stop layer 106, the interlayer dielectric material 110, the contact pillar 122 and a metallization layer 132 are similar to the semiconductor structure 200 illustrated in FIG. 2.

Figure 4:
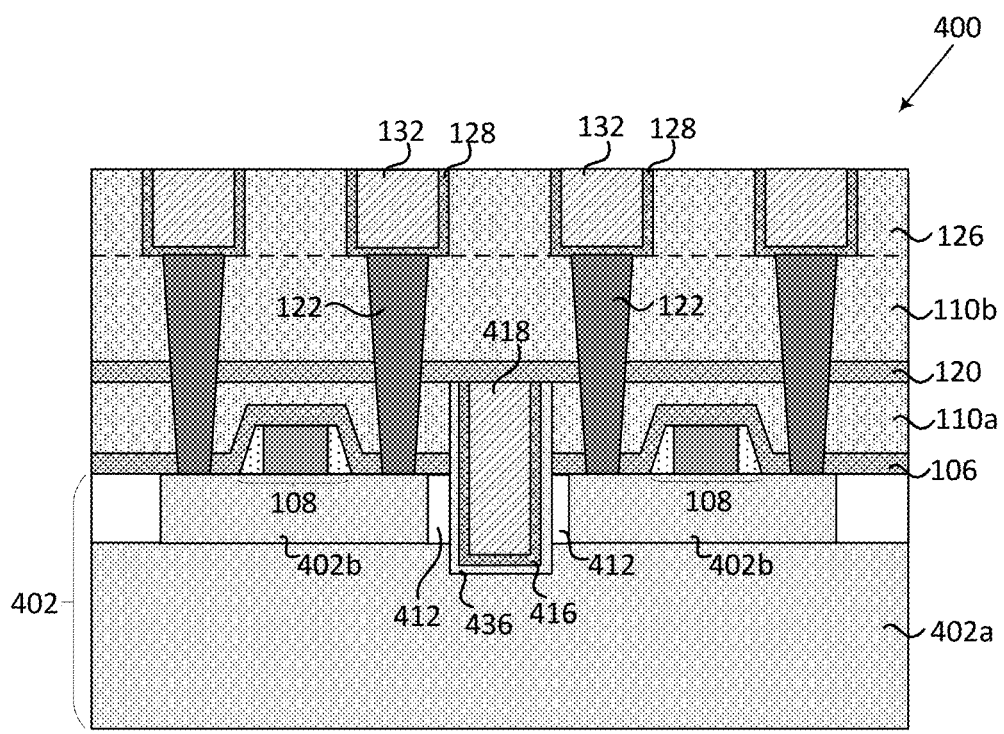
FIG. 4 illustrates a semiconductor structure, according to another embodiment of the disclosure.

FIG. 4 illustrates a semiconductor structure 400, according to another embodiment of the disclosure. Like numerals in FIG. 1 refer to like features in FIG. 4. In contrast to the semiconductor structures 100 and 200 illustrated in FIGS. 1 and 2, respectively, the semiconductor structure 400 includes a substrate 402 which may include a bulk semiconductor layer 402a and an active layer 402b. The active layer 402b may be arranged over the bulk semiconductor layer 402a. In one embodiment, the bulk semiconductor layer 402a and the active layer 402b may be made of silicon or any other suitable semiconductor material. An upper portion of a thermal shunt structure 418 may be arranged in an interlayer dielectric material 110 arranged above the substrate 402. A lower portion of the thermal shunt structure 418 may be arranged in the active layer 402b and a portion of the bulk semiconductor layer 402a. In one embodiment, a bottom surface of the thermal shunt structure 418 may be lower than a top surface of the bulk semiconductor layer 402a of the substrate 402. In another embodiment, the bottom surface of the thermal shunt structure 418 may be at least level with the top surface of the bulk semiconductor layer 402a. A conductive barrier liner 416 may be arranged over a side surface and a bottom surface of the thermal shunt structure 418. An insulating liner 436 may be arranged adjacent to the conductive barrier liner 416. The conductive barrier liner 416 may be similar to the conductive barrier liner 116 shown in FIG. 1. The insulating liner 436 may be similar to the insulating liner 236 shown in FIG. 2. An isolation structure 412 may be similar to the isolation structure 112 shown in FIG. 1. A heat generating device 108, a barrier dielectric layer 120, an etch stop layer 106, the interlayer dielectric material 110, a contact pillar 122 and a metallization layer 132 are similar to the semiconductor structure 200 illustrated in FIG. 2.

Figure 5:
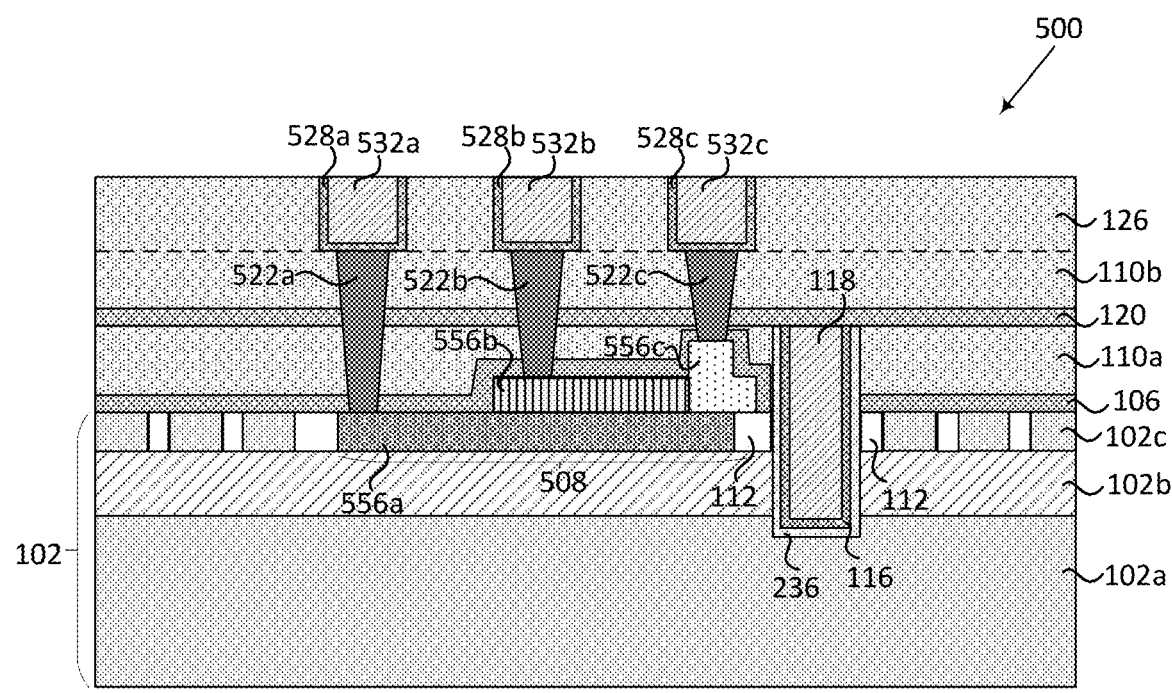
FIG. 5 illustrates a semiconductor structure, according to another embodiment of the disclosure.

FIG. 5 illustrates a semiconductor structure 500, according to another embodiment of the disclosure. Like numerals in FIGS. 1 and 2 refer to like features in FIG. 5. In contrast to the semiconductor structures 100 and 200 illustrated in FIGS. 1 and 2, respectively, the semiconductor structure 500 includes a heat generating device 508 provided over a substrate 102. The heat generating device 508 may be a vertical bipolar junction transistor (BJT). A portion of an active layer 102c of a substrate 102 may be a collector 556a of the bipolar junction transistor. In one embodiment, the collector 556a may be n-doped. A base 556b may be arranged above the collector 556a. In one embodiment, the base 556b may be p-doped. An emitter 556c may be arranged adjacent to the base 556b. In the one embodiment, the emitter 556c may be n-doped. In one embodiment, the base 556b and the emitter 556c may be made of silicon or any other suitable semiconductor material. An etch stop layer 106 may be arranged over the collector 556a, base 556b and emitter 556c of the heat generating device 508. The etch stop layer 106 may extend over an active layer 102c of the substrate 102 and an isolation structure 112 in the active layer 102c. A contact pillar 522a may be arranged above the collector 556a. A contact pillar 522b may be arranged above the base 556b. A contact pillar 522c may be arranged above the emitter 556c. A metallization layer 532a, 532b and 532c may be arranged above the contact pillars 522a, 522b and 522c, respectively. A thermal shunt structure 118 may be arranged proximal a base 556b and emitter 556c junction of the heat generating device 508 and below the metallization layer 532a, 532b and 532c. A barrier dielectric layer 120 and a portion of an interlayer dielectric material 110 may be arranged above the thermal shunt structure 118.

A conductive barrier liner 116 may be arranged over a side surface and a bottom surface of the thermal shunt structure 118. An insulating liner 236 may be arranged adjacent to the conductive barrier liner 116. In one embodiment, the insulating liner 236 may be an optional layer. In one embodiment, the insulating liner 236 and the conductive barrier liner 116 may be between the thermal shunt structure 118 and the etch stop layer 106 adjacent to the emitter 556c of the heat generating device 508. In an alternative embodiment, a first interlayer dielectric material 110a may be between the etch stop layer 106 adjacent to the emitter 556c and the insulating liner 236. An upper portion of the thermal shunt structure 118 may be arranged in the interlayer dielectric material 110 above the substrate 102. A lower portion of the thermal shunt structure 118 may be arranged in the substrate 102. The lower portion of the thermal shunt structure 118 may be adjacent to the isolation structure 112 in the active layer 102c of the substrate 102 and may extend to a first dielectric layer 102b and a base layer 102a of the substrate 102. The substrate 102, the thermal shunt structure 118, the conductive barrier liner 116, the insulating liner 236, the isolation structure 112, the barrier dielectric layer 120, the etch stop layer 106 and the interlayer dielectric material 110, may be similar to the semiconductor structure 200 illustrated in FIG. 2.

Figure 6:
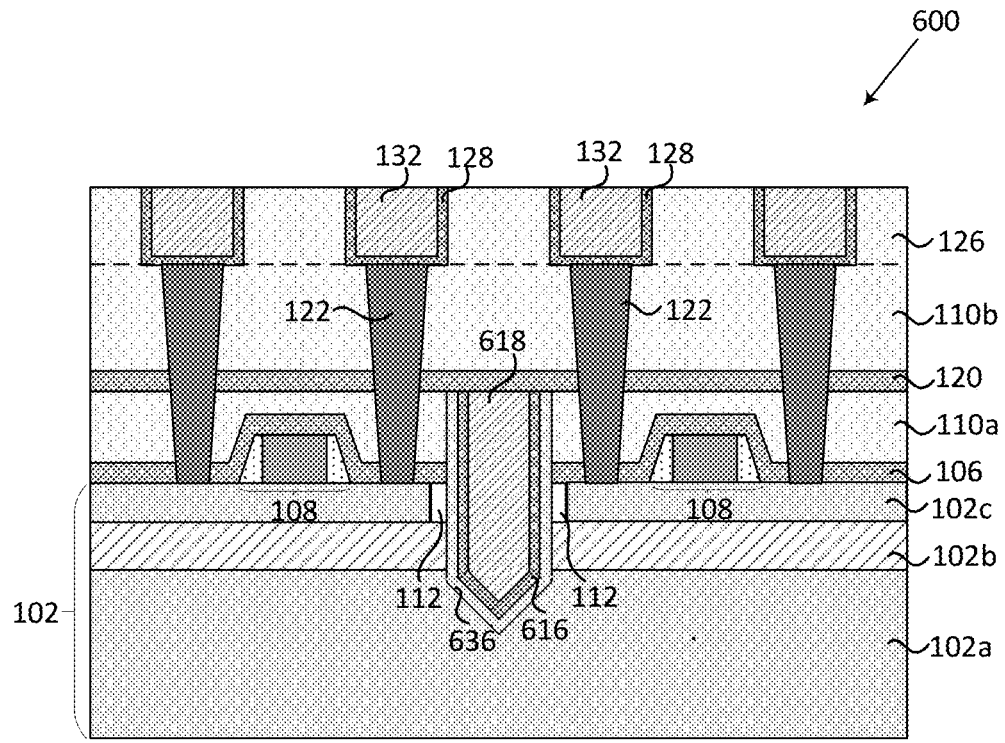
FIG. 6 illustrates a semiconductor structure, according to another embodiment of the disclosure.

FIG. 6 illustrates a semiconductor structure 600, according to another embodiment of the disclosure. Like numerals in FIG. 1 refer to like features in FIG. 6. In contrast to the semiconductor structures 100 and 200 shown in FIGS. 1 and 2, respectively, the semiconductor structure 600 includes a thermal shunt structure 618 having a non-planar bottom surface. In one embodiment, the bottom surface of the thermal shunt structure 618 may be a v-shaped groove. The non-planar bottom surface increases a surface area of the thermal shunt structure 618 thereby facilitating better heat dissipation. In one embodiment, the bottom surface of the thermal shunt structure 618 may be lower than a top surface of a base layer 102a of a substrate 102. A conductive barrier liner 616 may be arranged over a side surface and the bottom surface of the thermal shunt structure 618. An insulating liner 636 may be arranged adjacent to the conductive barrier liner 616. The substrate 102, a heat generating device 108, an isolation structure 112, a barrier dielectric layer 120, an etch stop layer 106, an interlayer dielectric material 110, a contact pillar 122 and a metallization layer 132 may be similar to the semiconductor structure 100 illustrated in FIG. 1.

Figure 7:
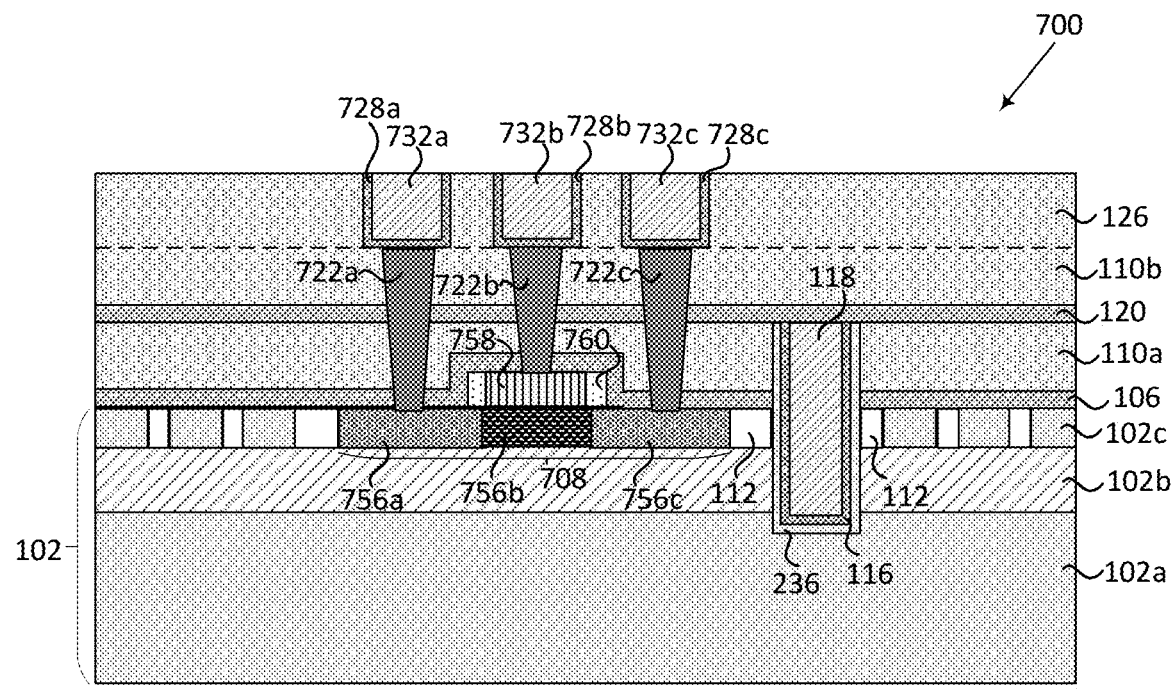
FIG. 7 illustrates a semiconductor structure, according to another embodiment of the disclosure.

FIG. 7 illustrates a semiconductor structure 700, according to another embodiment of the disclosure. Like numerals in FIG. 5 refer to like features in FIG. 7. In contrast to the semiconductor structure 500 illustrated in FIG. 5, the semiconductor structure 700 includes a heat generating device 708 provided over a substrate 102. The heat generating device 708 may be a lateral bipolar junction transistor (BJT). A collector 756a may be arranged in an active layer 102c of the substrate 102. In one embodiment, the collector 756a may be n-doped. A base 756b may be arranged in the active layer 102c of the substrate 102 and laterally adjacent to the collector 756a. In one embodiment, the base 756b may be p-doped. An emitter 756c may be arranged in the active layer 102c of the substrate 102 and laterally adjacent to the collector 756a and the base 756b. In one embodiment, the emitter 756c may be n-doped. The base 756b may be arranged between the collector 756a and the emitter 756c. A base contact 758 may be arranged above the base 756b. The base contact 758 may be p-doped and may be more heavily doped than the base 756b. In one embodiment, the base contact 758 may be made of a semiconductor material, for example silicon or any other suitable semiconductor material. In another embodiment, the base contact 758 may be made of a suitable conductive material, for example metal or any other suitable conductive material. A spacer structure 760 may be arranged next to a sidewall of the base contact 758. The spacer structure 760 may be made of a dielectric material or any other suitable insulating material. An etch stop layer 106 may be arranged over the collector 756a, base 756b, emitter 756c and the base contact 758 of the heat generating device 708. The etch stop layer 106 may extend over the active layer 102c of the substrate 102 and an isolation structure 112 in the active layer 102c. A contact pillar 722a may be arranged above the collector 756a. A contact pillar 722b may be arranged above the base contact 758. A contact pillar 722c may be arranged above the emitter 756c. A metallization layer 732a, 732b and 732c may be arranged above the contact pillars 722a, 722b and 722c, respectively. A thermal shunt structure 118 may be arranged proximal a base 756b and emitter 756c junction of the heat generating device 708 and below the metallization layer 732a, 732b and 732c. A barrier dielectric layer 120 and a portion of an interlayer dielectric material 110 may be arranged above the thermal shunt structure 118. A conductive barrier liner 116 may be arranged over a side surface and a bottom surface of the thermal shunt structure 118. An insulating liner 236 may be arranged adjacent to the conductive barrier liner 116. The substrate 102, the thermal shunt structure 118, the conductive barrier liner 116, the insulating liner 236, the isolation structure 112, the barrier dielectric layer 120, the etch stop layer 106 and the interlayer dielectric material 110, may be similar to the semiconductor structure 500 illustrated in FIG. 5.

Figure 8A:
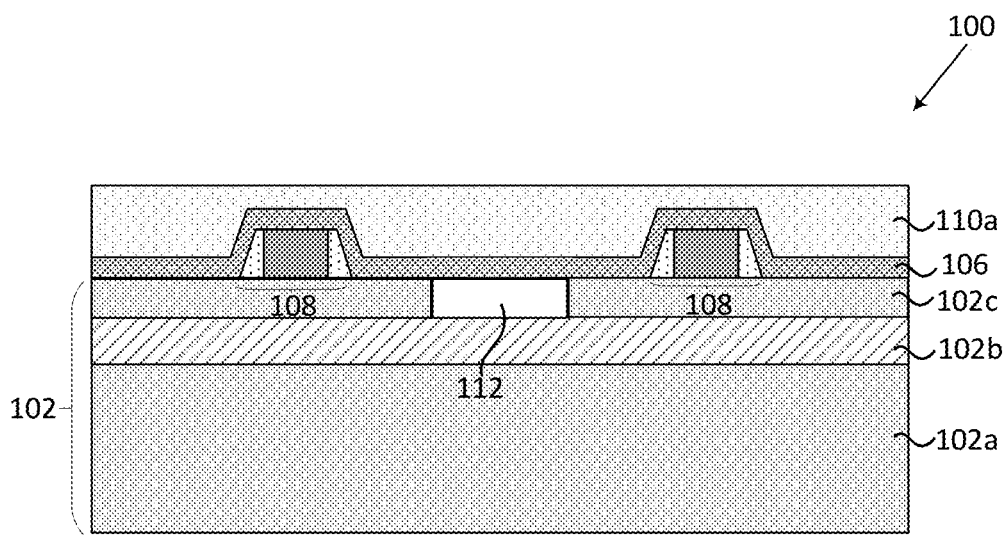
FIGS. 8A to 8E illustrate a fabrication process flow for the semiconductor structure illustrated in FIG. 1, according to some embodiments of the disclosure.

FIGS. 8A to 8E illustrate a fabrication process flow for the semiconductor structure 100 illustrated in FIG. 1, according to some embodiments of the disclosure. FIG. 8A illustrates a partially completed semiconductor structure 100 after formation of a first 110a interlayer dielectric material, according to an embodiment of the disclosure. Referring to FIG. 8A, a heat generating device 108 arranged over a substrate 102 may be provided. An isolation structure 112 may be provided in a portion of an active layer 102c of the substrate 102. An etch stop layer 106 may be provided over the heat generating device 108 and a top surface of the substrate 102 and the isolation structure 112. A first interlayer dielectric material 110a may be deposited over the etch stop layer 106. The deposition process may include depositing a layer of suitable dielectric material, for example silicon dioxide, high density plasma (HDP) undoped silicate glass (USG), tetraethyl orthosilicate (TEOS), or any other suitable dielectric material by chemical vapor deposition (CVD), physical vapor deposition (PVD), atomic layer deposition (ALD) or any other suitable deposition processes. A suitable planarizing process, for example chemical mechanical planarization (CMP) may be used to planarize a top surface of the first 110a interlayer dielectric material.

Figure 8B:
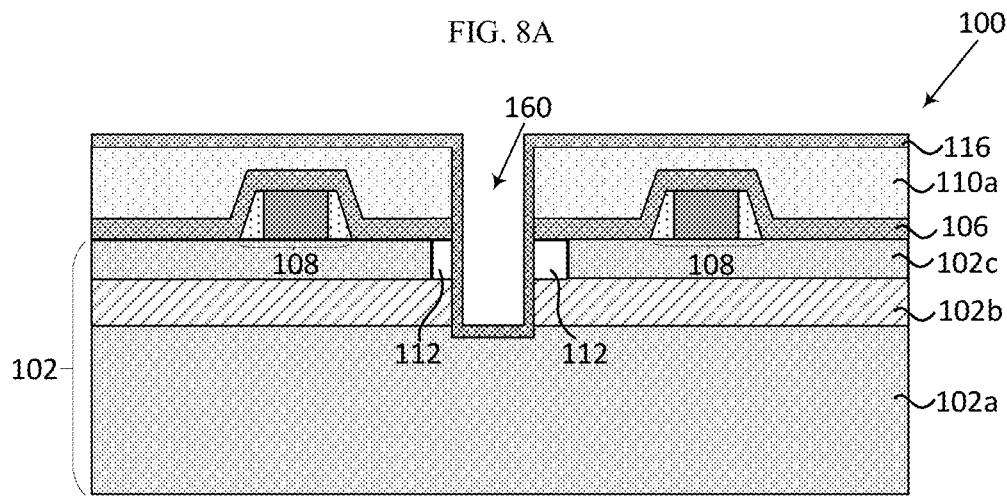

FIG. 8B illustrates a partially completed semiconductor structure 100 after formation of an opening 160 and a conductive barrier liner 116, according to an embodiment of the disclosure. Referring to FIG. 8B, an opening 160 may be formed in the first interlayer dielectric material 110a, through the etch stop layer 106, the isolation structure 112 and a first dielectric layer 102b below the isolation structure 112. The opening 160 may extend into a portion of a base layer 102a of the substrate 102 or may terminate at the surface of the base layer 102a. The opening 160 may be proximal to the heat generating device 108. The formation of the opening 160 may include deposition and patterning of a photoresist layer over the first 110a interlayer dielectric material by a conventional photolithography process followed by a wet or dry etch process. The photoresist layer may be patterned by a conventional photolithography process to form a suitable photoresist pattern. A wet or dry etch process may be used to remove a portion of the first 110a interlayer dielectric material, the etch stop layer 106, the isolation structure 112, the first dielectric layer 102b and the base layer 102a not covered by the photoresist pattern. The photoresist layer may subsequently be removed. A conductive barrier liner 116 may be formed over a side surface and a bottom surface of the opening 160. The formation of the conductive barrier liner 116 may include depositing a layer of suitable conductive material, for example tantalum nitride or any other suitable conductive material by chemical vapor deposition (CVD), physical vapor deposition (PVD), atomic layer deposition (ALD) or any other suitable deposition processes.

Figure 8C:
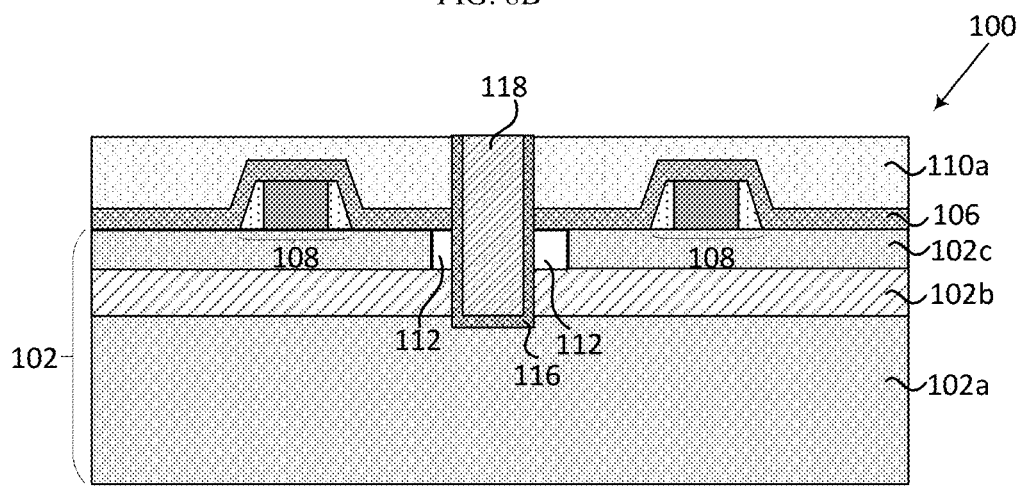

FIG. 8C illustrates a partially completed semiconductor structure 100 after formation of a thermal shunt structure 118, according to an embodiment of the disclosure. Referring to FIG. 8C, a layer of thermally conductive material, for example copper (Cu), aluminum (Al), tungsten (W), nickel (Ni) or any other suitable thermally conductive material may be deposited over the conductive barrier liner 116 in the opening 160. The deposition process may be by electroplating, chemical vapor deposition (CVD), physical vapor deposition (PVD) or any other suitable deposition processes. A suitable planarization process such as chemical mechanical planarization may be used to remove a portion of the copper layer and the conductive barrier liner 116 from a top surface of the first 110a interlayer dielectric material. The planarization process may leave behind another portion of the conductive barrier liner 116 over a side surface and a bottom surface of the opening 160. The planarization process may also leave behind another portion of copper in the opening 160, thereby forming the thermal shunt structure 118. The thermal shunt structure 108 may be proximal to the heat generating device 108.

Figure 8D:
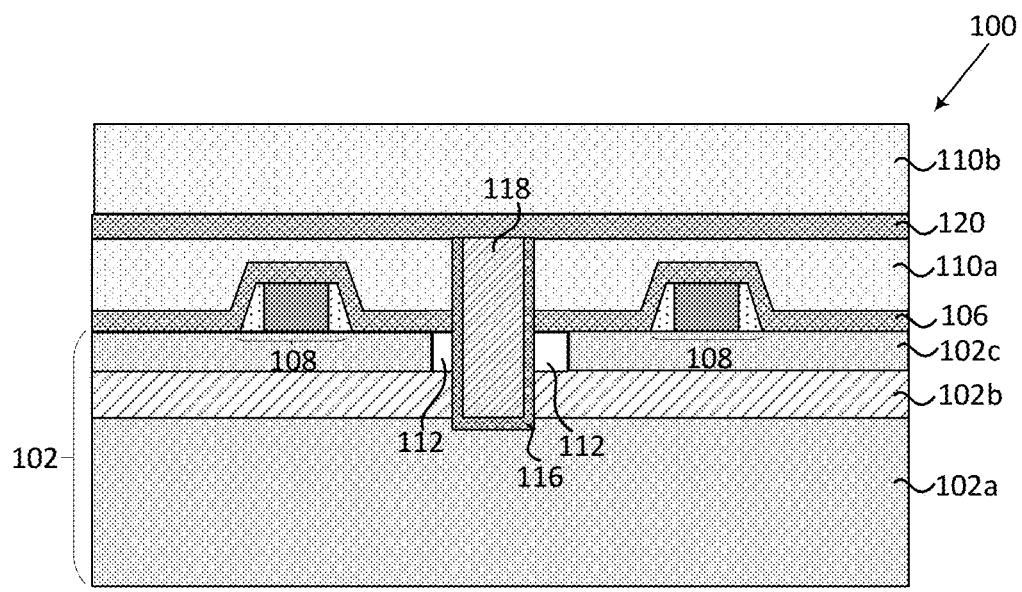

FIG. 8D illustrates a partially completed semiconductor structure 100 after formation of a barrier dielectric layer 120 and a second interlayer dielectric material 110b, according to an embodiment of the disclosure. The formation of the barrier dielectric layer 120 may include depositing a layer of silicon nitride ($Si_3N_4$) or any other suitable dielectric material over a top surface of the first 110a interlayer dielectric material, the conductive barrier liner 116 and the thermal shunt structure 118. A second 110b interlayer dielectric material may be deposited over the barrier dielectric layer 120. The formation of the second 110b interlayer dielectric material may include depositing a layer of suitable dielectric material, for example silicon dioxide, high density plasma (HDP) undoped silicate glass (USG), tetraethyl orthosilicate (TEOS), or any other suitable dielectric material by chemical vapor deposition (CVD), physical vapor deposition (PVD), atomic layer deposition (ALD) or any other suitable deposition processes. In one embodiment, the first 110a and the second 110b interlayer dielectric material may be made of the same dielectric material. In another embodiment, the first 110a and second 110b interlayer dielectric material may be made of different dielectric materials. The first 110a and second 110b interlayer dielectric material may collectively be referred to as interlayer dielectric material 110.

Figure 8E:
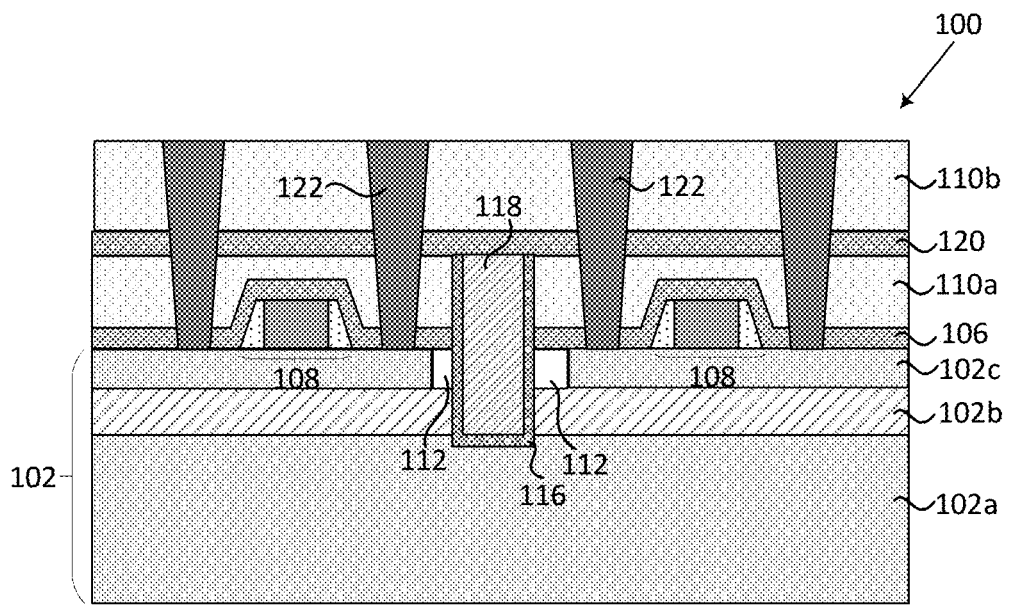

FIG. 8E illustrates a partially completed semiconductor structure 100 after formation of a contact pillar 122, according to an embodiment of the disclosure. Referring to FIG. 8E, the formation of the contact pillar 122 may include forming an opening in the interlayer dielectric material 110, through the barrier dielectric layer 120 and the etch stop layer 106 to expose a portion of the active layer 102c of the substrate 102. The formation of the opening may include deposition and patterning of a photoresist layer over the interlayer dielectric material 110 by a conventional photolithography process followed by a wet or dry etch process. A layer of suitable electrically conductive material, for example cobalt (Co), tungsten (W) or any other suitable electrically conductive material may be deposited in the opening by chemical vapor deposition (CVD), physical vapor deposition (PVD) or any other suitable deposition processes. A suitable planarization process such as chemical mechanical planarization may be used to remove a portion of the cobalt layer from a top surface of the interlayer dielectric material 110, to leave behind another portion of the cobalt layer in the opening thereby forming the contact pillar 122.

The process continues to form the structure shown in FIG. 1. A layer of intermetal dielectric 126 (WED) may be formed over the interlayer dielectric material 110. A metallization layer 132 may be formed in the intermetal dielectric layer 126 over the contact pillar 122. A conductive barrier layer 128 may be formed over a side surface and a bottom surface of the metallization layer 132. A bottom surface of the conductive barrier layer 128 may be in contact with a top surface of the contact pillar 122. The formation of the intermetal dielectric layer 126 may include depositing a layer of suitable dielectric material, for example silicon dioxide, undoped silicate glass (USG), fluorinated silicate glass (FSG), tetraethyl orthosilicate (TEOS), or any other suitable dielectric material by chemical vapor deposition (CVD), physical vapor deposition (PVD), atomic layer deposition (ALD) or any other suitable deposition processes. The formation of the conductive barrier layer 128 and the metallization layer 132 may include forming an opening in the intermetal dielectric layer 126 by a conventional photolithography process followed by a wet or dry etch process. A layer of suitable conductive material, for example tantalum nitride or any other suitable conductive material may be deposited over a side surface and a bottom surface of the opening to form the barrier layer 128. A layer of suitable conductive material, for example copper or any other suitable conductive material may be deposited over the tantalum nitride in the opening by electroplating, chemical vapor deposition (CVD), physical vapor deposition (PVD) or any other suitable deposition processes to form the metallization layer 132. A suitable planarization process, for example chemical mechanical planarization may be used to remove a portion of the copper layer and the tantalum nitride layer from a top surface of the intermetal dielectric layer 126 to leave behind a layer of copper and tantalum nitride in the opening.

Figure 9A:
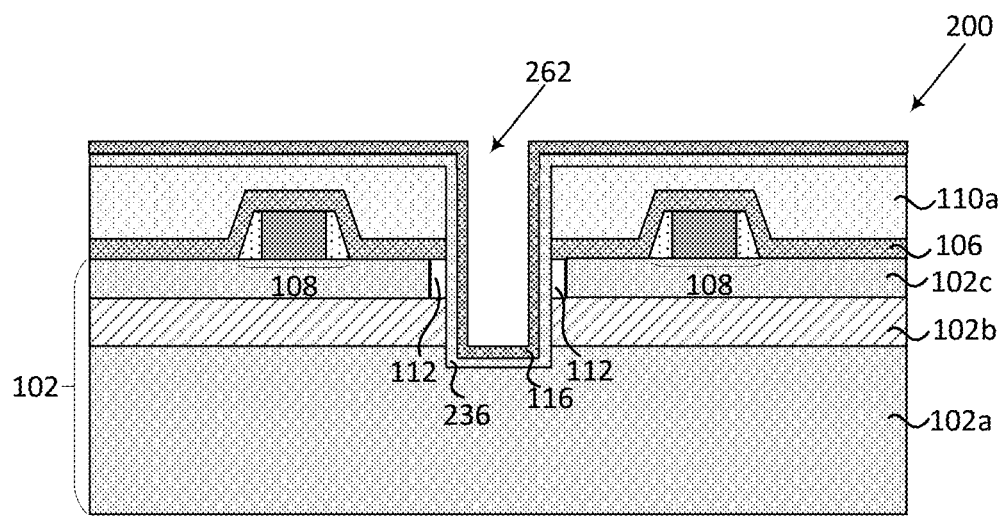
FIGS. 9A to 9C illustrate a fabrication process flow for the semiconductor structure illustrated in FIG. 2, according to some embodiments of the disclosure.
Figure 9B:
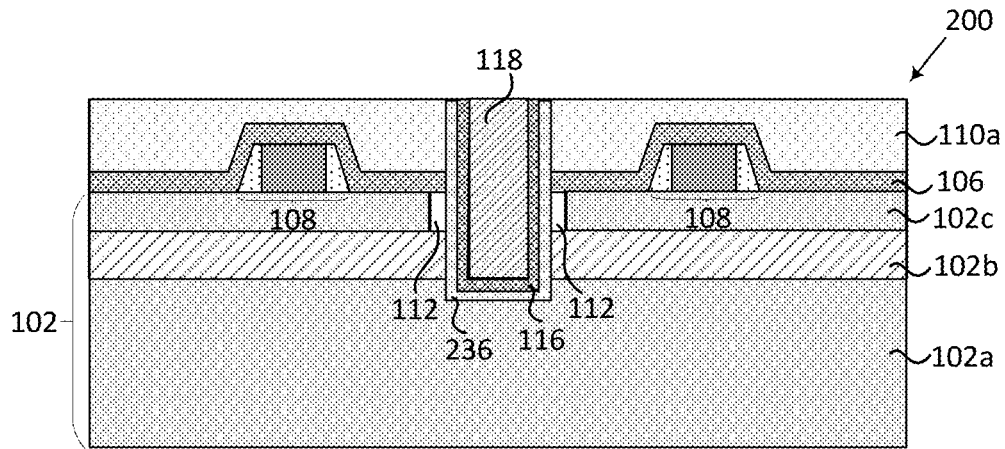
Figure 9C:
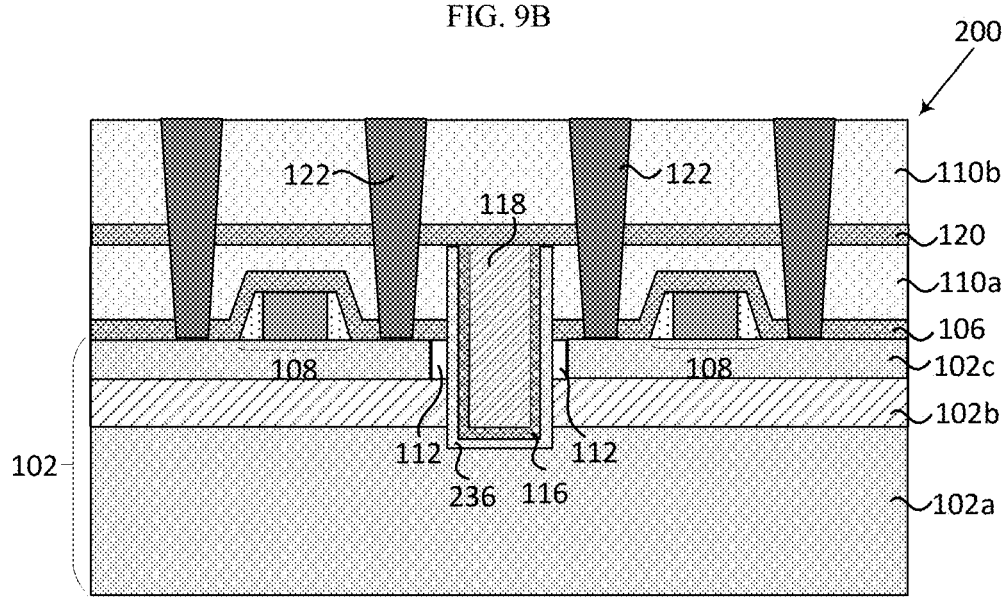

FIGS. 9A to 9C illustrate a fabrication process flow for the semiconductor structure 200 illustrated in FIG. 2, according to some embodiments of the disclosure. FIG. 9A illustrates a partially completed semiconductor structure 200 after formation of a first interlayer dielectric material 110a, an opening 262, an electrically insulating liner 236 and a conductive barrier liner 116, according to an embodiment of the disclosure. Referring to FIG. 9A, a heat generating device 108 arranged over a substrate 102 may be provided. An isolation structure 112 may be provided in a portion of an active layer 102c of the substrate 102. An etch stop layer 106 may be provided over the heat generating device 108 and a top surface of the substrate 102 and the isolation structure 112. A first 110a interlayer dielectric material may be deposited over the etch stop layer 106. The formation of the first 110a interlayer dielectric material may be similar to the process illustrated in FIG. 8A. An opening 262 may be formed in the first 110a interlayer dielectric material, through the isolation structure 112 and a first dielectric layer 102b. In one embodiment, the opening 262 may extend to a base layer 102a of the substrate 102. In another embodiment, the opening 262 may terminate on a top surface of the base layer 102a. The formation of the opening 262 may be similar to the formation of the opening 160 illustrated in FIG. 8B. An electrically insulating liner 236 may be deposited over a side surface of a bottom surface of the opening 262. The deposition of the electrically insulating liner 236 may include depositing a layer of suitable electrically insulating material, for example silicon dioxide, silicon nitride or any other suitable electrically insulating material by chemical vapor deposition (CVD), physical vapor deposition (PVD), atomic layer deposition (ALD) or any other suitable deposition processes. A layer of conductive barrier liner 116 may be deposited over the electrically insulating liner 236. The deposition of the layer of conductive barrier liner 116 may be similar to the process illustrated in FIG. 8B.

FIG. 9B illustrates a partially completed semiconductor structure 200 after formation of a thermal shunt structure 118, according to an embodiment of the disclosure. The formation of the thermal shunt structure 118 and the conductive barrier liner 116 may be similar to the process illustrated in FIG. 8C. A suitable planarization process, for example chemical mechanical planarization may be used to remove a portion of the electrically insulating liner 236 from a top surface of the first 110a interlayer dielectric material leaving behind another portion of the electrically insulating liner 236 over the side surface and bottom surface of the opening 262.

FIG. 9C illustrates a partially completed semiconductor structure 200 after formation of a barrier dielectric layer 120, a second 110b interlayer dielectric material and a contact pillar 122, according to an embodiment of the disclosure. Referring to FIG. 9C, a barrier dielectric layer 120 may be formed over a top surface of the first 110a interlayer dielectric material, the electrically insulating liner 236, the conductive barrier liner 116 and the thermal shunt structure 118. A second 110b interlayer dielectric material may be formed over the barrier dielectric layer 120. The first 110a and second 110b interlayer dielectric material may collectively be referred to as interlayer dielectric material 110. A contact pillar 122 may be formed in the interlayer dielectric material 110. The contact pillar 122 may extend through the barrier dielectric layer 120 and the etch stop layer 106 to contact a top surface of the active layer 102c. The formation of the barrier dielectric layer 120, the second 110b interlayer dielectric material and the contact pillar 122 may be similar to the process shown in FIGS. 8D and 8E.

The process continues to form the structure as shown in FIG. 2. An intermetal dielectric layer 126 may be formed over the second 110b interlayer dielectric material and the contact pillar 122. A metallization layer 132 and a conductive barrier layer 128 may be formed in the intermetal dielectric layer 126 above the contact pillar 122. The formation of the intermetal dielectric layer 126, the metallization layer 132 and the conductive barrier layer 128 may be similar to the process description shown in FIG. 1.

Referring back to FIG. 3, the fabrication process flow may be similar to the fabrication process flow shown in FIGS. 9A to 9C. Following the fabrication process shown in FIG. 9C, a contact pillar 338 may be formed in a second 110b interlayer dielectric material. The formation of the contact pillar 338 may include patterning the second 110b interlayer dielectric material and a barrier dielectric layer 120 to form an opening to expose a top surface of a thermal shunt structure 118. The formation of the opening may be by a conventional photolithography process followed by a wet or dry etch process. A layer of suitable electrically conductive material, for example cobalt (Co), tungsten (W) or any other suitable electrically conductive material may be deposited in the opening by chemical vapor deposition (CVD), physical vapor deposition (PVD) or any other suitable deposition processes. A suitable planarization process, for example chemical mechanical planarization may be used to remove a portion of the cobalt layer from a top surface of the second 110b interlayer dielectric material to leave behind another portion of the cobalt layer in the opening. A layer of intermetal dielectric layer 126 may be formed over the second 110b interlayer dielectric material and the contact pillars 122 and 338. Metallization layers 132 and 352 may be formed in the intermetal dielectric layer 126 and over the contact pillars 122 and 338, respectively. Conductive barrier layers 128 and 350 may be formed over a side surface and a bottom surface of the metallization layers 132 and 352, respectively. The formation of the metallization layers 132 and 352 and the conductive barrier layers 128 and 350 may be similar to the formation of the metallization layer 132 and the conductive barrier layer 128 shown in FIG. 2.

Referring back to FIG. 4, the fabrication process flow may be similar to the fabrication process flow shown in FIG. 8A. In contrast to the process flow shown in FIG. 8A, a substrate 402 may be provided. The substrate 402 may include a bulk semiconductor layer 402a and an active layer 402b arranged over the bulk semiconductor layer 402a. Following the process shown in FIG. 8A, a first 110a interlayer dielectric material, an etch stop layer 106, an isolation structure 412 and the bulk semiconductor layer 402a may be patterned to form an opening. The formation of the opening may be by conventional photolithography process followed by a wet or dry etch process. An electrically insulating liner 436 may be formed over a side surface and a bottom surface of the opening. A conductive barrier layer 416 may be formed over the electrically insulating liner 436. A thermal shunt structure 418 may be formed over the conductive barrier layer 416. A barrier dielectric layer 120 may be formed over the thermal shunt structure 418, the conductive barrier layer 416 and the electrically insulating liner 436. A second interlayer dielectric material 110b may be formed over the barrier dielectric layer 120. A contact pillar 122 may be formed in the interlayer dielectric material 110 and through the barrier dielectric layer 120 and the etch stop layer 106. The process continues to form the structure shown in FIG. 4. An intermetal dielectric layer 126 may be formed over the contact pillar 122 and the interlayer dielectric material 110. A metallization layer 132 may be formed in the intermetal dielectric layer 126 over the contact pillar 122. A conductive barrier layer 128 may be formed over a side surface and a bottom surface of the metallization layer 132. The formation of the intermetal dielectric layer 126, the metallization layer 132 and the conductive barrier layer 128 may be similar to the process description shown in FIG. 1.

Referring back to FIG. 5, a heat generating device 508 arranged over a substrate 102 may be provided. An etch stop layer 106 may be provided over the heat generating device 508, a top surface of an active layer 102c and an isolation structure 112. A first 110a interlayer dielectric material may be formed over the etch stop layer 106. The formation of the first 110a interlayer dielectric material may be similar to the process shown in FIG. 8A. The first 110a interlayer dielectric material, the etch stop layer 106, the isolation structure 112, a first dielectric layer 102b and a base layer 102a of the substrate 102 may be patterned to form an opening. The formation of the opening may be by conventional photolithography process followed by a wet or dry etch process. The opening may be proximal to a base 556b and emitter 556c junction of the heat generating device 508. An electrically insulating liner 236 may be formed over a side surface and a bottom surface of the opening. A conductive barrier liner 116 may be formed over the electrically insulating liner 236. A thermal shunt structure 118 may be formed over the conductive barrier liner 116 in the opening. The formation of the electrically insulating liner 236, conductive barrier liner 116 and the thermal shunt structure 118 may be similar to the process shown in FIGS. 9A and 9B. A dielectric barrier layer 120 may be formed over a top surface of the first 110a interlayer dielectric material, the electrically insulating liner 236, the conductive barrier liner 116 and the thermal shunt structure 118. A second 110b interlayer dielectric material may be formed over the dielectric barrier layer 120. A contact pillar 522a, 522b and 522c may be formed in the interlayer dielectric material 110, the dielectric barrier layer 120 and the etch stop layer 106 over the collector 556a, base 556b and emitter 556c, respectively. The formation of the dielectric barrier layer 120 and the second 110b interlayer dielectric material may be similar to the process shown in FIG. 9C. The formation of the contact pillars 522a, 522b and 522c may include patterning the interlayer dielectric material 110, the dielectric barrier layer 120 and the etch stop layer 106 over the collector 556a, base 556b and emitter 556c, respectively to form an opening. The patterning may be by conventional photolithography and a wet or dry etch process. A suitable conductive material, for example tungsten or any other suitable conductive material may be deposited in the opening to form the contact pillars 522a, 522b and 522c. A layer of intermetal dielectric 126 may be formed over the interlayer dielectric material 110 and the contact pillars 522a, 522b and 522c. A metallization layer 532a, 532b and 532c and a conductive barrier layer 528a, 528b and 528c may be formed in the intermetal dielectric layer 126 and over the contact pillars 522a, 522b and 522c, respectively. The conductive barrier layer 528a, 528b and 528c may be formed over a side surface and a bottom surface of the metallization layers 532a, 532b and 532c, respectively. The formation of the intermetal dielectric layer 126, the metallization layers 532a, 532b and 532c and the conductive barrier layer 528a, 528b and 528c may be similar to the process description shown in FIG. 1.

Referring back to FIG. 6, the fabrication process flow may be similar to the process flow shown in FIG. 8A. An opening with a v-shaped bottom surface may be formed in a first 110a interlayer dielectric material, through an etch stop layer 106, an isolation structure 112, a portion of a first dielectric layer 102b and a portion of a base layer 102a of a substrate 102. The formation of the opening in the base layer 102a of the substrate 102 may include a wet etch process selective to a crystal orientation of the substrate 102, for example potassium hydroxide (KOH), ammonium hydroxide (NH₄OH) or any other suitable wet etch process. An electrically insulating liner 636 may be provided over a side surface and a bottom surface of the opening. A conductive barrier liner 616 may be formed over the electrically insulating liner 636. A thermal shunt structure 618 may be formed over the conductive barrier liner 616 in the opening. The formation of the electrically insulating liner 636, conductive barrier liner 616 and the thermal shunt structure 618 may be similar to the process shown in FIGS. 9A and 9B. A dielectric barrier layer 120 may be provided over a top surface of the first 110a interlayer dielectric material, the electrically insulating liner 636, the conductive barrier liner 616 and the thermal shunt structure 618. A second 110b interlayer dielectric material may be provided over the dielectric barrier layer 120. The formation of the dielectric barrier layer 120 and the second 110b interlayer dielectric material may be similar to the process shown in FIG. 9C. A contact pillar 122 may be formed in the interlayer dielectric material 110, the dielectric barrier layer 120 and the etch stop layer 106. The formation of the contact pillar 122 may be similar to the process shown in FIG. 9C. The process continues to form the structure shown in FIG. 6. A layer of intermetal dielectric layer 126 may be formed over the second 110b interlayer dielectric material and the contact pillar 122. A metallization layer 132 and a conductive barrier layer 128 may be formed in the intermetal dielectric layer 126 and over the contact pillar 122. The conductive barrier layer 128 may be formed over a side surface and a bottom surface of the metallization layer 132. The formation of the intermetal dielectric layer 126, the metallization layer 132 and the conductive barrier layer 128 may be similar to the process description shown in FIG. 1.

Referring back to FIG. 7, a heat generating device 708 arranged over a substrate 102 may be provided. An etch stop layer 106 may be provided over the heat generating device 708, a top surface of an active layer 102c and an isolation structure 112. A first 110a interlayer dielectric material may be formed over the etch stop layer 106. The formation of the first 110a interlayer dielectric material may be similar to the process shown in FIG. 8A. An opening may be formed in the first 110a interlayer dielectric material, the etch stop layer 106, the isolation structure 112, a first dielectric layer 102b and a base layer 102a of the substrate 102. The formation of the opening may be by conventional photolithography process followed by a wet or dry etch process. The opening may be proximal to a base 756b and emitter 756c junction of the heat generating device 708. An electrically insulating liner 236 may be formed over a side surface and a bottom surface of the opening. A conductive barrier liner 116 may be formed over the electrically insulating liner 236. A thermal shunt structure 118 may be formed over the conductive barrier liner 116 in the opening. The formation of the electrically insulating liner 236, conductive barrier liner 116 and the thermal shunt structure 118 may be similar to the process shown in FIGS. 9A and 9B. A dielectric barrier layer 120 may be formed over a top surface of the first 110a interlayer dielectric material, the electrically insulating liner 236, the conductive barrier liner 116 and the thermal shunt structure 118. A second 110b interlayer dielectric material may be formed over the dielectric barrier layer 120. A contact pillar 722a, 722b and 722c may be formed in the interlayer dielectric material 110, the dielectric barrier layer 120 and the etch stop layer 106 over the collector 756a, base contact 758 and emitter 756c, respectively. The formation of the dielectric barrier layer 120 and the second 110b interlayer dielectric material may be similar to the process shown in FIG. 9C. The formation of the contact pillars 722a, 722b and 722c may include patterning the interlayer dielectric material 110, the dielectric barrier layer 120 and the etch stop layer 106 over the collector 756a, base contact 758 and emitter 756c, respectively to form an opening. The patterning may be by conventional photolithography and a wet or dry etch process. A suitable conductive material, for example tungsten or any other suitable conductive material may be deposited in the opening to form the contact pillars 722a, 722b and 722c. A layer of intermetal dielectric 126 may be formed over the interlayer dielectric material 110 and the contact pillars 722a, 722b and 722c. A metallization layer 732a, 732b and 732c and a conductive barrier layer 728a, 728b and 728c may be formed in the intermetal dielectric layer 126 and over the contact pillars 722a, 722b and 722c, respectively. The conductive barrier layer 728a, 728b and 728c may be formed over a side surface and a bottom surface of the metallization layers 732a, 732b and 732c, respectively. The formation of the intermetal dielectric layer 126, the metallization layers 732a, 732b and 732c and the conductive barrier layer 728a, 728b and 728c may be similar to the process description shown in FIG. 1.

The terms "first", "second", "third", and the like in the description and in the claims, if any, are used for distinguishing between similar elements and not necessarily for describing a particular sequential or chronological order. It is to be understood that the terms so used are interchangeable under appropriate circumstances such that the embodiments of the device described herein are, for example, capable of operation in sequences other than those illustrated or otherwise described herein. The terms "left", "right", "front", "back", "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the device described herein are, for example, capable of operation in other orientations than those illustrated or otherwise described herein. Similarly, if a method is described herein as comprising a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device.

While several exemplary embodiments have been presented in the above detailed description of the device, it should be appreciated that number of variations exist. It should further be appreciated that the embodiments are only examples, and are not intended to limit the scope, applicability, dimensions, or configuration of the devices in any way. Rather, the above detailed description will provide those skilled in the art with a convenient road map for implementing an exemplary embodiment of the devices, it being understood that various changes may be made in the function and arrangement of elements and method of fabrication described in an exemplary embodiment without departing from the scope of this disclosure as set forth in the appended claims.

What is claimed:

1. A semiconductor structure comprising:
a heat generating device over a substrate;
an interlayer dielectric (ILD) material over the heat generating device and the substrate;
a metallization layer over the interlayer dielectric material; and
a thermal shunt structure proximal the heat generating device, wherein an upper portion of the thermal shunt structure is in the interlayer dielectric material and below the metallization layer, and a lower portion of the thermal shunt structure is in the substrate, the thermal shunt structure extends partially into the interlayer dielectric material, and a portion of the interlayer dielectric material is arranged over a top surface of the thermal shunt structure and extends laterally below the metallization layer.

2. The semiconductor structure of claim 1 further comprising:
an isolation structure adjacent to the lower portion of the thermal shunt structure, wherein the lower portion of the thermal shunt structure extends through the isolation structure.

3. The semiconductor structure of claim 2 further comprising:
an electrically insulating liner adjacent to a side surface and a bottom surface of the thermal shunt structure, wherein the insulating liner is between the isolation structure and the lower portion of the thermal shunt structure.

4. The semiconductor structure of claim 1, wherein the substrate comprises a first dielectric layer and an active layer above the first dielectric layer, and the lower portion of the thermal shunt structure is in the active layer and the first dielectric layer of the substrate.

5. The semiconductor structure of claim 4, wherein the substrate further comprises a base layer below the first dielectric layer and the lower portion of the thermal shunt structure extends to the base layer of the substrate.

6. The semiconductor structure of claim 5, wherein a bottom surface of the thermal shunt structure is at least level with a top surface of the base layer of the substrate.

7. The semiconductor structure of claim 1, wherein the substrate comprises an active layer over a bulk semiconductor layer and the lower portion of the thermal shunt structure extends through the active layer to the bulk semiconductor layer of the substrate.

8. The semiconductor structure of claim 7, wherein a bottom surface of the thermal shunt structure is lower than a top surface of the bulk semiconductor layer of the substrate.

9. The semiconductor structure of claim 1 further comprising:
a barrier dielectric layer over the top surface of the thermal shunt structure, wherein the barrier dielectric layer covers at least a portion of the top surface of the thermal shunt structure.

10. The semiconductor structure of claim 1, wherein the heat generating device is a field effect transistor (FET).

11. The semiconductor structure of claim 1, wherein the heat generating device is a bipolar junction transistor (BJT) and the thermal shunt structure is proximal to an emitter-base junction of the bipolar junction transistor.

12. A semiconductor structure comprising:
a heat generating device over a substrate;
an interlayer dielectric (ILD) material over the heat generating device and the substrate;
a metallization layer over the interlayer dielectric material;
a thermal shunt structure proximal the heat generating device, wherein an upper portion of the thermal shunt structure is in the interlayer dielectric material and is spaced from the metallization layer, and a lower portion of the thermal shunt structure is in the substrate, the thermal shunt structure is formed of a thermally conductive metal material;
an electrically insulating dielectric liner on a side surface and a bottom surface of the thermal shunt structure; and
a barrier dielectric layer over the thermal shunt structure, the barrier dielectric layer covers and abuts at least a portion of a top surface of the thermally conductive metal material of the thermal shunt structure, wherein the barrier dielectric layer is between the thermal shunt structure and the interlayer dielectric material.

13. The semiconductor structure of claim 12 further comprising:
an isolation structure adjacent to the electrically insulating dielectric liner on the lower portion of the thermal shunt structure.

14. The semiconductor structure of claim 12 further comprising:
a contact pillar over the thermal shunt structure coupling the thermal shunt structure to the metallization layer.

15. A method of fabricating a semiconductor structure comprising:
providing a heat generating device over a substrate;
providing an interlayer dielectric material over the heat generating device and the substrate;
providing a thermal shunt structure proximal the heat generating device, wherein an upper portion of the thermal shunt structure is in the interlayer dielectric material and a lower portion of the thermal shunt structure is in the substrate; and
providing a metallization layer over the interlayer dielectric material, wherein the upper portion of the thermal shunt structure is below the metallization layer, the thermal shunt structure extends partially into the interlayer dielectric material, and a portion of the interlayer dielectric material is arranged over a top surface of the thermal shunt structure and extends laterally below the metallization layer.

16. The method of claim 15, wherein providing an interlayer dielectric material over the heat generating device and the substrate further comprises:
providing a first interlayer dielectric material over the heat generating device and the substrate.

17. The method of claim 16, wherein providing a thermal shunt structure proximal the heat generating device further comprises:
forming an opening in the first interlayer dielectric material and the substrate;
forming a thermal shunt structure in the opening in the first interlayer dielectric material and the substrate; and
forming a barrier dielectric layer over a top surface of the thermal shunt structure and the first interlayer dielectric material.

18. The method of claim 17, wherein providing a metallization layer over the interlayer dielectric material further comprises:
- providing a second interlayer dielectric material over the barrier dielectric layer and the thermal shunt structure;
- forming a contact pillar in the first interlayer dielectric material, the barrier dielectric layer and the second interlayer dielectric material; and
- forming a metallization layer over the contact pillar and the second interlayer dielectric material.

19. The method of claim 17, wherein forming an opening in the substrate further comprises:
- forming an opening in an isolation structure in the substrate and a portion of the substrate below the isolation structure.

20. The method of claim 19, further comprising:
- forming an electrically insulating liner over a side surface and a bottom surface of the opening in the isolation structure in the substrate, and the portion of the substrate below the isolation structure.

* * * * *